United States Patent [19]

Shimizu et al.

[11] Patent Number: 5,854,316
[45] Date of Patent: Dec. 29, 1998

[54] EPOXY RESIN COMPOSITION

[75] Inventors: Ken Shimizu, Nagoya; Yasushi Sawamura, Otsu; Masayuki Tanaka, Nagoya, all of Japan

[73] Assignee: Toray Industries, Inc., Japan

[21] Appl. No.: 793,460

[22] PCT Filed: Jul. 10, 1996

[86] PCT No.: PCT/JP96/01919

§ 371 Date: Feb. 26, 1996

§ 102(e) Date: Feb. 26, 1996

[87] PCT Pub. No.: WO97/03129

PCT Pub. Date: Jan. 30, 1997

[30] Foreign Application Priority Data

Jul. 10, 1995 [JP] Japan .................................. 7/173267

[51] Int. Cl.$^6$ ............................................. C08L 63/00
[52] U.S. Cl. ......................... 523/442; 523/443; 525/523
[58] Field of Search ............................ 523/442, 443; 525/523

[56] References Cited

U.S. PATENT DOCUMENTS

| 5,056,214 | 10/1991 | Holt | ................................. 29/602.1 |
| 5,362,775 | 11/1994 | Shintai et al. | ................... 523/451 |
| 5,552,459 | 9/1996 | Baumann et al. | ................ 523/427 |

FOREIGN PATENT DOCUMENTS

| 60-84361 | 5/1985 | Japan . |
| 61-64756 | 4/1986 | Japan . |
| 61-203121 | 9/1986 | Japan . |
| 63-160254 | 7/1988 | Japan . |
| 63-183915 | 7/1988 | Japan . |
| 63-299151 | 12/1988 | Japan . |
| 4-188855 | 7/1992 | Japan . |
| 4-325517 | 11/1992 | Japan . |
| 5-36867 | 2/1993 | Japan . |

OTHER PUBLICATIONS

Hawley's Condensed Chemical Dictionary, pp. 47 and 1034, 12th edition, 1993.

*Primary Examiner*—Randy Gulakowski
*Attorney, Agent, or Firm*—Austin R. Miller

[57] ABSTRACT

An epoxy resin composition composed of an epoxy resin (A), a hardener (B), and an inorganic filler (C), characterized in that the content of the inorganic filler (C) is 70–97 wt % and the inorganic filler (C) contains 0.1–50 wt % of alumina. When used to seal semiconductor devices, it exhibits good moldability and imparts to the sealed semiconductors good flame retardance, solder heat resistance, and reliability at high temperatures.

14 Claims, No Drawings

EPOXY RESIN COMPOSITION

TECHNICAL FIELD

The present invention relates to an epoxy resin composition to seal semiconductor devices, a process for producing it, and a semiconductor device sealed with it, said epoxy resin composition being superior in flame retardance, solder heat resistance, and reliability at high temperatures.

BACKGROUND ART

The sealing of semiconductor devices and other electronic parts usually employs a sealing resin composition composed of epoxy resin, hardener, and inorganic filler because of its low price, high manufacturing efficiency, and balanced properties. Demand for sealing resin compositions has become more stringent than before in accordance with recent thin, dense semiconductor devices which need good solder heat resistance and reliability at high temperatures.

For the sake of safety, semiconductor devices and other electronic parts are required to possess flame retardance conforming to the UL standard. For this reason, it has been common practice to incorporate sealing resin compositions with a flame retard ant (such as brominated epoxy resin and other halogenated polymers) and a flame retarding auxiliary (such as antimony trioxide and other antinomy compounds).

Recent environmental issues have turned public attention to a variety of compounds used as a flame retardant in resin compositions to seal semiconductor devices. It has been pointed out that flame retardants based on a halogenated polymer give off a halogenated gas at the time of their combustion. In addition, it is considered that flame retardants in a hot environment give off a halogenated gas which gradually corrodes the wiring of semiconductor devices to reduce their reliability. Moreover, flame-retarded sealing resin compositions pose a problem with waste disposal if the flame retardant contains an antimony compound. Therefore, it is desirable to minimize the amount of halogenated polymer and antimony compound.

There are substitutes for halogenated polymer and antimony oxide mentioned above. They are hydroxide- and phosphorus-based flame retardants (such as aluminum hydroxide and phosphate ester) disclosed in Japanese Patent Laid-open No. 240314/1987. Unfortunately, they need to be incorporated into sealing resin compositions in large quantities for good flame retardance. The result is deteriorated resin performance and poor molding appearance due to their decomposition and foaming that occur during molding. These disadvantages limit their use to special areas.

The present invention is characterized by incorporating the epoxy resin composition with alumina in a specific amount as part of an inorganic filler. The idea of incorporating an epoxy resin composition with alumina as part of inorganic filler is disclosed in Japanese Patent Laid-open Nos. 70446/1985 and 183915/1985. Alumina in such use is intended for heat dissipation from semiconductor devices. Nothing is mentioned in the disclosures about the use of alumina as a flame retardant.

In view of the foregoing, the present invention was completed to fulfill the following objects.

(1) Flame retardance: To provide an epoxy resin composition which exhibits good flame retardance after curing.
(2) Moldability: To provide an epoxy resin composition which can be molded without voids when used to seal semiconductor devices.
(3) Solder heat resistance: To provide an epoxy resin composition which is immune to cracking when the sealed semiconductor devices are soldered at high temperatures.
(4) Reliability at high temperatures: To provide an epoxy resin composition which permits the sealed semiconductor devices to retain their performance during storage at high temperatures.

DISCLOSURE OF THE INVENTION

The above-mentioned objects are achieved by an epoxy resin composition composed of an epoxy resin (A), a hardener (B), and an inorganic filler (C), characterized in that the content of the inorganic filler (C) is 70–97 wt % and the inorganic filler (C) contains 0.1–50 wt % of alumina.

According to a preferred embodiment, the epoxy resin composition is characterized in that the content of the inorganic filler (C) is 70–97 wt % and the inorganic filler (C) contains 0.1–20 wt % of alumina.

According to another preferred embodiment, the epoxy resin composition is characterized in that the content of the inorganic filler (C) is 87–97 wt % and the inorganic filler (C) contains 0.1–50 wt % of alumina.

According to the present invention, the epoxy resin composition is produced by melt-mixing an epoxy resin (A), a hardener (B), and an inorganic filler (C) containing 0.1–20 wt % of alumina, the amount of (C) being 70–97 wt % of the total amount of the resin composition.

According to the present invention, the epoxy resin composition is produced also by melt-mixing an epoxy resin (A), a hardener (B), and an inorganic filler (C) containing 0.1–50 wt % of alumina, the amount of (C) being 87–97 wt % of the total amount of the resin composition.

The present invention also covers a semiconductor device sealed with the above-mentioned epoxy resin composition.

The epoxy resin composition pertaining to the present invention exhibits improved moldability and improved solder heat resistance and permits semiconductor devices sealed with it to possess improved reliability at high temperatures and good flame retardance.

BEST MODE FOR CARRYING OUT THE INVENTION

The epoxy resin (A) used in the present invention is not specifically restricted so long as it has a plurality of epoxy groups in the molecule. It includes, for example, biphenol type epoxy resin, cresol novolak type epoxy resin, phenol novolak type epoxy resin, bisphenol A type epoxy resin, novolak type epoxy resin synthesized from bisphenol A and resorcinol, straight-chain aliphatic epoxy resin, alicyclic epoxy resin, and heterocyclic epoxy resin.

Of these examples of the epoxy resin (A) used in the present invention, those which contain as an essential component the biphenyl type epoxy resin (a) having the skeleton represented by the formula (I) below are preferable because of their good moldability and solder heat resistance.

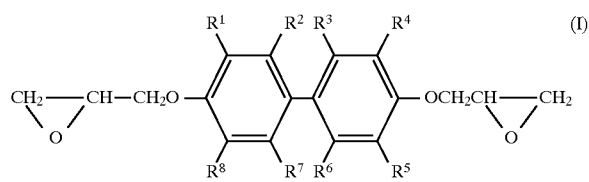

(where $R^1$ to $R^8$ each denote a hydrogen atom, a halogen atom, or a $C_{1-4}$ alkyl group.)

According to the present invention, the epoxy resin (A) should contain the biphenyl type epoxy resin having the skeleton represented by the formula (I) in an amount more than 50 wt %, preferably more than 70 wt %.

Preferred examples of the epoxy skeleton represented by the formula (I) include the following.
4,4'-bis(2,3-epoxypropoxy)biphenyl,
4,4'-bis(2,3-epoxypropoxy)-3,3',5,5'-tetramethylbiphenyl,
4,4'-bis(2,3-epoxypropoxy)-3,3',5,5'-tetramethyl-2-chlorobiphenyl,
4,4'-bis(2,3-epoxypropoxy)-3,3',5,5'-tetramethyl-2-bromobiphenyl,
4,4'-bis(2,3-epoxypropoxy)-3,3',5,5'-tetraethylbiphenyl,
4,4'-bis(2,3-epoxypropoxy)biphenyl, and
4,4 '-bis(2,3-epoxypropoxy)-3,3',5,5'-tetramethylbiphenyl.

They may be used alone or in combination with one another to produce the desired effect.

The epoxy resin (A) may be a combination of two or more epoxy resins.

According to the present invention, the epoxy resin (A) should be used in an amount of usually 0.05–25 wt %, preferably 1.5–15 wt %, more preferably 2–15 wt %, still more preferably 2–10 wt %, and most preferably 2–8 wt %.

The hardener (B) used in the present invention is not specifically restricted so long as it is capable of having a hardening reaction with the epoxy resin (A). Usually, it is a compound having phenolic hydroxyl groups, a compound having an acid anhydride, or an amine.

Examples of the compound having two or more phenolic hydroxyl groups in the molecule include phenol novolak resin, cresol novolak resin, phenolaralkyl resin, novolak resin synthesized from bisphenol A and resorcinol, tris(hydroxyphenyl)methane, dihydrobiphenyl, and polyhydric phenol compounds (such as phenol-p-xylylene copolymer represented by the formula (II) below and polyvinyl phenol).

Examples of the compound having an acid anhydride include maleic anhydride, phthalic anhydride, and pyromellitic anhydride.

Examples of the amine include aromatic amines, such as metaphenylenediamine, di(aminophenyl)methane (commonly called diaminodiphenylmethane), and diaminodiphenylsulfone.

Phenol-based hardeners are desirable for the epoxy resin to seal semiconductor devices because of their ability to impart good heat resistance, moisture resistance, and storage properties to the epoxy resin. It is possible to use two or more hardeners in combination.

According to the present invention, the hardener (B) should be used in an amount of usually 1–20 wt %, preferably 1.5–15 wt %, and more preferably 1–10 wt %, for the total amount of the epoxy resin composition. The stoichiometric ratio of the hardener (B) to the epoxy resin (A) should be 0.5–1.5, particularly 0.8–1.2, so that the resulting epoxy resin composition has good mechanical properties and moisture resistance.

The present invention permits using a curing catalyst to accelerate hardening reaction between the epoxy resin (A) and the hardener (B). The curing catalyst is not specifically restricted so long as it accelerates the hardening reaction. It includes imidazole compounds (such as 2-methylimidazole, 2,4-dimethylimidazole, 2-ethyl-4-methylimidazole, 2-phenylimidazole, 2-phenyl-4-methylimidazole, and 2-heptadecylimidazole), tertiary amines (such as triethylamine, benzyldimethylamine, α-methylbenzyldimethylamine, 2-(dimethylaminomethyl)phenol, 2,4,6-tris(dimethylaminomethyl)phenol, and 1,8-diazabicyclo(5.4.0)undecene-7), organometallic compounds (such as zirconium tetramethoxide, zirconium tetrapropoxide, tetrakis(acetylaceto)zirconium, and tri(acetylaceto)aluminum), and organic phosphine compounds (such as triphenylphosphine, trimethylphosphine, triethylphosphine, tributylphosphine, tri(p-methylphenyl)phosphine, and tri(nonylphenyl)phosphine). Of these examples, organic phosphine compounds are desirable from the standpoint of moisture resistance. Two or more curing catalysts may be used in combination. The amount of the curing catalyst should preferably be 0.1–10 pbw for 100 pbw of the epoxy resin (A).

According to the present invention, the content of the inorganic filler (C) in the epoxy resin compound should be 70–97 wt % and the inorganic filler (C) should contain 0.1–50 wt % of alumina. In a first preferred embodiment, the content of the inorganic filler (C) is 70–97 wt % and the content of alumina is 0.1–20 wt %. In a second preferred embodiment, the content of the inorganic filler (C) is 87–97 wt % and the content of alumina is 0.1–50 wt %. These specifications are intended for good flame retardance and moldability. The term "alumina" means aluminum oxide.

The amount of alumina in the inorganic filler (C) should be preferably 1–20 wt %, more preferably 1–18 wt %, still more preferably 1–10 wt %, and most preferably 1–9 wt %.

The inorganic filler (C) may contain, in addition to alumina, silica or silicon dioxide. The amount of silica (based on the inorganic filler (C)) should be 50–99.9 wt %, preferably 52.9–99 wt %, more preferably 80–99 wt %, and most preferably 90–99 wt %.

The inorganic filler (C) may take on the form of particles in which alumina and silica coexist or a mixture of particles containing more than 50 wt % alumina and particles containing more than 50 wt % silica. The latter is desirable because of its good effect on many properties. It should preferably be a mixture of alumina particles composed mainly of alumina and silica particles composed mainly of silica.

The particles composed mainly of alumina are classified as α-type, γ-type, δ-type, and θ-type according to their crystalline structure. Any type is acceptable and two or more types may be used in combination. α-Alumina is desirable because of its thermal and chemical resistance and heat conductivity. It may be prepared in any manner, such as by the Bayer process and vaporized metal combustion of aluminum powder.

The particles composed mainly of silica are classified as amorphous silica and crystalline silica. The former is desirable because of its effect of reducing the coefficient of linear expansion (and hence reducing stress). It may be produced in any manner, such as fusing of crystalline silica and synthesis from several raw materials.

The present invention does not impose any restrictions on the inorganic filler and the shape and diameter of the alumina and silica particles contained in the inorganic filler. The particles should preferably be spherical and have a diameter in the range of 3 to 40 μm. The amount of the particles should be more than 60 wt %, preferably more than 90 wt %, of the inorganic filler from the standpoint of flowability at the time of molding. The average particle diameter as used in the present invention means the median diameter at 50% of cumulative oversize distribution.

According to the present invention, the ratio of the inorganic filler (C) is specified as above; however, it should preferably be 80–97 wt %, more preferably 85–97 wt %, still more preferably 87–97 wt %, and most preferably 87–95 wt %, from the standpoint of flame retardance, moldability, and stress reduction.

The inorganic filler should preferably undergo surface treatment with a coupling agent, such as silane coupling agent, titanate coupling agent, and aluminate coupling agent, so that the resulting epoxy resin composition contributes to the reliability of semiconductor devices sealed with it.

A commonly used silane coupling agent is a silicon compound in which hydrolyzable groups (such as alkoxyl groups, halogen atoms, and amine groups) and organic groups are connected directly to a silicon atom. It may also be in the form of partially hydrolyzed condensate. Preferred hydrolyzable groups are alkoxyl groups, especially methoxy groups and ethoxy groups. The organic groups include hydrocarbon groups with or without substituent groups such as nitrogen, oxygen, halogen, and sulfur. Silane coupling agents having substituted hydrocarbons are preferable. Substituent groups may be epoxy groups or amino groups, especially secondary amino groups. In the preferred case, all amino groups are secondary amino groups.

Following are examples of the silane coupling agent.

Those in which the organic group has an epoxy group. γ-glycidoxypropylmethoxysilane, γ-glycidoxypropylmethyldimethoxysilane, and γ-(2,3-epoxycyclohexyl)propyltrimethoxysilane.

Those in which the organic group has an amino group. N-β-(aminoethyl)-γ-aminopropyltrimethoxysilane, N-β-(aminoethyl)-γ-aminopropylmethyldimethoxysilane, N-β-(aminoethyl)-γ-aminopropyltriethylsilane, γ-aminopropyltriethoxysilane, γ-aminopropyldiethoxysilane, γ-aminopropyltrimethoxysilane, γ-aminopropylmethyldimethoxysilane, γ-(N,N-dimethylamino)propyltrimethoxysilane, γ-(N-phenylamino)propyltrimethoxysilane, γ-(N-phenylamino)propylmethyldimethoxysilane, γ-(N-methylamino)propyltrimethoxysilane, γ-(N-methylaminopropyl)methyldimethoxysilane, γ-(N-methylaminopropyl)methyldimethoxysilane, γ-(N-ethylamino)propyltrimethoxysilane, and γ-(N-ethylamino)propylmethyldimethoxysilane.

Others. γ-methacryloxypropyltrimethoxysilane, γ-methacryloxypropylmethyldimethoxysilane, γ-mercaptopropyltrimethoxysilane, and γ-mercaptopropylmethyldimethoxysilane.

The epoxy resin composition of the present invention may optionally be incorporated with a bromine compound which is commonly used to impart flame retardance to ordinary epoxy resin compositions to seal semiconductor devices.

Preferred examples of the bromine compound include brominated epoxy resins (such as brominated bisphenol A type epoxy resin and brominated phenol novolak type epoxy resin), brominated polycarbonate resin, brominated polystyrene resin, brominated polyphenylene oxide resin, tetrabromobisphenol A, and decabromodiphenyl ether. Of thee examples, brominated epoxy resins are preferable from the standpoint of moldability.

The amount of the bromine compound in the epoxy resin composition of the present invention should be less than 0.3 wt % for good flame retardance and reliability at high temperatures. It should preferably be less than 0.1 wt %, more preferably less than 0.05 wt %, and most desirably substantially null. The amount of bromine (in terms of element) should be less than 0.2 wt %, preferably 0.07 wt %, and most preferably 0.04 wt %.

The epoxy resin composition of the present invention may optionally be incorporated with any known antimony compound which is commonly used as a flame retarding auxiliary for ordinary epoxy resin compositions to seal semiconductor devices. Preferred examples of the antimony compound include antimony trioxide, antimony tetroxide, and antimony pentoxide.

The amount of the antimony compound in the epoxy resin composition of the present invention should be less than 0.3 wt % for good flame retardance and reliability at high temperatures. It should preferably be less than 0.1 wt %, more preferably less than 0.05 wt %, and most desirably substantially null. The amount of antimony (in terms of element) should be less than 0.25 wt %, preferably 0.075 wt %, and most preferably 0.0375 wt %.

The epoxy resin composition of the present invention should preferably have an oxygen index greater than 42% after curing. The oxygen index is calculated by the equation below according to JIS K7201. It is a numerical value (in vol %) representing the minimum concentration of oxygen required to sustain combustion.

Oxygen index (%)=[oxygen]/([oxygen]+[nitrogen])×100

The epoxy resin composition of the present invention should preferably have the flame retardance of rating V-0 specified by the UL standards after curing. This rating is necessary for good solder heat resistance and reliability at high temperatures. In addition, this rating should be achieved when the epoxy resin composition contains bromine atoms or antimony atoms in an amount specified above.

The epoxy resin composition of the present invention may optionally be incorporated with coloring agents (such as carbon black and iron oxide), ion-capturing agents (such as hydrotalcite), elastomers (such as olefin copolymer, modified nitrile rubber, and modified polybutadiene rubber), thermoplastic resins (such as polyethylene), mold release agents (such as long-chain fatty acid, metal salt of long-chain fatty acid, ester of long-chain fatty acid, amide of long-chain fatty acid, and paraffin wax), polyorganosiloxane gum or oil having organic groups modified with epoxy group, carboxyl group, hydroxyl group, amino group, or the like), silicon compounds, and crosslinking agents (such as peroxides).

The epoxy resin composition of the present invention should preferably be prepared by melt-mixing at usually 50°–170° C., preferably 70°–150° C., by using a Banbury mixer, kneader, roll mixer, single- or twin-screw extruder, or Buss Ko-Kneader.

The epoxy resin composition of the present invention is usually used in the form of powder or tablet to seal semiconductor devices. It is fed to a part containing a semiconductor element fixed to a substrate by using a low-pressure transfer molding machine, and then it is cured at 120°–250° C., preferably 150°–200° C. If necessary, the cured product undergoes post heat treatment (at 150°–200° C. for 2–15 hours, for example). In this way there is obtained a semiconductor device with a cured epoxy resin composition.

The semiconductor device means electronic circuits (or integrated circuits) composed of transistors, diodes, resistors, capacitors, etc. which are arranged and wired on a substrate.

The invention will be described in more detail with reference to the following examples and comparative examples, in which the following raw materials were used.

Epoxy resin I: o-cresol novolak resin having an epoxy equivalent of 200. (See Table 1 for content.)

Epoxy resin II: 4,4'-bis(2,3-epoxypropoxy)-3,3',5,5'-tetramethylbiphenyl. (See Table 1 for content.)

Hardener I: phenol novolak resin having a hydroxyl equivalent of 107. (See Table 1 for content.)

Hardener II: phenol compound represented by the formula below. (See Table 1 for content.)

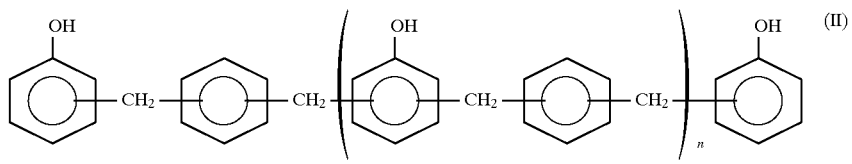

(where those fractions in which n is 1–3 account for about 90 wt %.)

Inorganic filler I: spherical α-alumina having an average particle diameter of 16 μm. ("AS-30" from Showa Denko K.K.) (See Table 1 for content.)

Inorganic filler II: amorphous fused silica having an average particle diameter of 15 μm. (See Table 1 for content.)

Flame retardant: brominated bisphenol A type resin having an epoxy equivalent of 400 and containing 50 wt % bromine. (See Table 1 for content.)

Flame retarding auxiliary: antimony trioxide. (See Table 1 for content.)

Cure accelerator: triphenylphosphine. (0.1 wt %)

Silane coupling agent: N-phenylaminopropyltrimethoxysilane. (1.0 wt %) Previously mixed with the inorganic filler.

Coloring agent: carbon black. (0.2 wt %)

Mold release agent: carnauba wax. (0.3 wt %)

EXAMPLES AND COMPARATIVE EXAMPLES

The raw materials were dry-blended by using a mixer according to the formulation shown in Table 1. The resulting dry blend was mixed for 5 minutes using a mixing roll, with the roll surface temperature kept at 90° C. The mixture was cooled and crushed to give the desired epoxy resin composition to seal semiconductor devices.

The resin composition was molded by low-pressure transfer molding under the following conditions.
  molding temperature: 175° C.,
  cure time: 2 minutes, and
  post curing at 180° C. for 5 hours.

The cured product was tested for physical properties as follows:

Solder heat resistance: Tested on 160 pin QFP (quad flat package) measuring 12×12 mm and containing an Al-deposited imitated element. Twenty samples were conditioned at 85° C. and 85 %RH for 72 hours and then heated in an IR reflow furnace at 245° C. (maximum). They were examined for the number of external cracks.

Water absorption: The same samples as above (160 pin QFP) were conditioned at 85° C. and 85 % RH for 100 hours, and the amount of water picked up by the sample was measured. Water absorption is an index of solder heat resistance.

Reliability at high temperatures: Tested at 200° C. on 16 pin DIP (dual in-line package). The result is expressed in terms of time required for the cumulative failure rate to reach 63%.

Flame retardance test: Specimens each measuring 5"×½"×1/16" were molded and post-cured, and they were tested for flame retardance according to the UL94 standards.

Oxygen index: Specimens each measuring 5"×½"×1/8" were molded and post-cured, and they were tested according to JIS K7201 and expressed as follows.

Oxygen index (%)=[oxygen]/([oxygen]+[nitrogen])×100

PKG filling properties: The samples used for solder heat resistance were visually and microscopically examined for voids and short shot.

The results are shown in Table 2.

TABLE 1

| Example (Comparative Example) | Amount of epoxy resin (wt %) | | Amount of hardener (wt %) | | Amount of filler (wt %) | | Values for reference | | Amount of flame retardant (wt %) | Amount of flame retarding auxiliary (wt %) |
|---|---|---|---|---|---|---|---|---|---|---|
| | I | II | I | II | I | II | I + II | Alumina* | | |
| 1 | | 9.08 | | 7.32 | 3.0 | 79.0 | 82.0 | 3.7 | 0.00 | 0.00 |
| 2 | | 9.08 | | 7.32 | 14.0 | 68.0 | 82.0 | 17.1 | 0.00 | 0.00 |
| 3 | | 6.28 | | 5.12 | 3.0 | 84.0 | 87.0 | 3.5 | 0.00 | 0.00 |
| 4 | | 6.28 | | 5.12 | 15.0 | 72.0 | 87.0 | 17.2 | 0.00 | 0.00 |
| 5 | | 6.28 | | 5.12 | 40.0 | 47.0 | 87.0 | 46.0 | 0.00 | 0.00 |
| 6 | | 5.62 | 1.26 | 2.52 | 8.0 | 81.0 | 89.0 | 9.0 | 0.00 | 0.00 |
| 7 | 1.74 | 3.46 | | 4.20 | 8.0 | 81.0 | 89.0 | 9.0 | 0.00 | 0.00 |
| 8 | | 1.87 | | 1.53 | 3.0 | 92.0 | 95.0 | 3.3 | 0.00 | 0.00 |
| 9 | | 1.87 | | 1.53 | 16.0 | 79.0 | 95.0 | 16.9 | 0.00 | 0.00 |
| 10 | | 1.87 | | 1.53 | 42.0 | 53.0 | 95.0 | 44.2 | 0.00 | 0.00 |
| (1) | | 16.19 | | 13.21 | 10.0 | 59.0 | 69.0 | 14.5 | 0.00 | 0.00 |
| (2) | | 9.08 | | 7.32 | 0.0 | 82.0 | 82.0 | 0.0 | 0.00 | 0.00 |
| (3) | | 9.08 | | 7.32 | 33.0 | 59.0 | 82.0 | 40.0 | 0.00 | 0.00 |
| (4) | | 7.38 | | 6.02 | 0.0 | 85.0 | 85.0 | 0 | 0.00 | 0.00 |
| (5) | | 7.38 | | 6.02 | 50.0 | 35.0 | 85.0 | 58.8 | 0.00 | 0.00 |
| (6) | | 6.28 | | 5.12 | 0.0 | 87.0 | 87.0 | 0 | 0.00 | 0.00 |
| (7) | | 6.28 | | 5.12 | 48.0 | 39.0 | 87.0 | 55.2 | 0.00 | 0.00 |
| (8) | | 1.87 | | 1.53 | 0.0 | 95.0 | 95.0 | 0 | 0.00 | 0.00 |

TABLE 1-continued

| Example (Comparative Example) | Amount of epoxy resin (wt %) I | Amount of epoxy resin (wt %) II | Amount of hardener (wt %) I | Amount of hardener (wt %) II | Amount of filler (wt %) I | Amount of filler (wt %) II | Values for reference I + II | Values for reference Alumina* | Amount of flame retardant (wt %) | Amount of flame retarding auxiliary (wt %) |
|---|---|---|---|---|---|---|---|---|---|---|
| (9) |  | 1.87 |  | 1.53 | 53.0 | 42.0 | 95.0 | 55.8 | 0.00 | 0.00 |
| (10) |  | 4.54 |  | 3.86 | 0.0 | 89.0 | 89.0 | 0 | 0.50 | 0.50 |

*Content of alumina (wt %) based on the amount of filler (I).

TABLE 2

| Example (Comparative Example) | Oxygen index (%) | Rating of flame retardance | Reliability at high temperatures (life in hours) | PKG filling properties | Solder heat resistance (number of cracks) | Water absorption (%) |
|---|---|---|---|---|---|---|
| 1 | 44 | V-0 | >400 | good | 0/20 | 0.20 |
| 2 | 54 | V-0 | >400 | good | 1/20 | 0.25 |
| 3 | 47 | V-0 | >400 | good | 0/20 | 0.20 |
| 4 | 59 | V-0 | >400 | good | 0/20 | 0.21 |
| 5 | 60 | V-0 | >400 | voids | 5/20 | 0.32 |
| 6 | 63 | V-0 | >400 | good | 0/20 | 0.19 |
| 7 | 61 | V-0 | >400 | good | 0/20 | 0.19 |
| 8 | 62 | V-0 | >400 | good | 0/20 | 0.11 |
| 9 | 70 | V-0 | >400 | good | 0/20 | 0.18 |
| 10 | 70 | V-0 | >400 | voids | 3/20 | 0.27 |
| (1) | 26 | HB | >400 | good | 20/20 | 0.34 |
| (2) | 40 | HB | >400 | good | 12/20 | 0.21 |
| (3) | 53 | V-1 | >400 | good | 20/20 | 0.35 |
| (4) | 42 | HB | >400 | good | 10/20 | 0.21 |
| (5) | 55 | HB | >400 | voids | 20/20 | 0.35 |
| (6) | 44 | V-2 | >400 | good | 0/20 | 0.19 |
| (7) | 55 | V-1 | >400 | voids | 20/20 | 0.36 |
| (8) | 50 | V-0 | >400 | voids | 0/20 | 0.15 |
| (9) | 62 | V-1 | >400 | voids | 20/20 | 0.27 |
| (10) | 45 | V-0 | 70 | good | 3/20 | 0.15 |

It is noted from Table 2 that the epoxy resin compositions of the present invention are superior in flame retardance, solder heat resistance, reliability at high temperatures, and PKG filling properties. By contrast, in the case where the amount of the inorganic filler (C) is less than 70%, or in the case where no alumina is used even though the amount of the inorganic filler (C) is more than 70%, the epoxy resin compositions in comparative examples are poor in flame retardance. In the case where the inorganic filler (C) contains an excess amount of alumina, the samples are poor in flame retardance and filling properties. Those samples containing flame retardant and flame-retarding auxiliary but containing no alumina are superior in flame retardance but poor in reliability at high temperatures.

It has been demonstrated above that the inorganic filler containing a specific amount of alumina contributes to flame retardance, moldability, solder heat resistance, and high reliability when the resin composition is applied to semiconductor devices.

Exploitation in Industry

The epoxy resin composition of the present invention will find use as a sealing material for semiconductor devices because of its good moldability, solder heat resistance, flame retardance, and reliability at high temperatures.

We claim:

1. An epoxy resin composition composed of an epoxy resin (A), a hardener (B), and an inorganic filler (C) containing silica and alumina as an essential component, characterized in that said epoxy resin (A) contains as an essential component a biphenyl type epoxy resin having the structure represented by the formula (I) below:

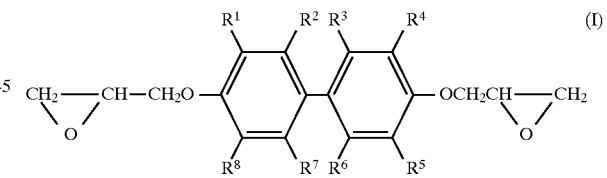

where $R^1$ to $R^8$ each denote a hydrogen atom, a halogen atom, or a $C_{1-4}$ alkyl group, and wherein the content of the inorganic filler (C) is 70–97 wt %, based on the total weight of the composition, and the inorganic filler (C) contains 0.1–20 wt % of alumina.

2. An epoxy resin composition as defined in claim 1, wherein the content of the inorganic filler (C) is 82–97 wt % of the total weight of the composition.

3. An epoxy resin composition as defined in claim 1, wherein the content of silica is 80–99.9 wt % of the weight of the inorganic filler (C).

4. An epoxy resin composition as defined in claim 1, characterized in that, after curing, it has a flame retardance rating of V-0 specified by UL94 standards.

5. An epoxy resin composition as defined in claim 1, wherein the content of the epoxy resin (A) is 2–15 wt % and the content of the hardener (B) is 1–20 wt %, both based on the total weight of the epoxy resin composition.

6. A epoxy resin composition as defined in claim 1, wherein the content of the epoxy resin (A) is 2–10 wt % and the content of the hardener (B) is 1–10 wt %, both based on the total weight of the epoxy resin composition.

7. A semiconductor device sealed with an epoxy resin composition as defined in claims 1 or 8.

8. An epoxy resin composition composed of an epoxy resin (A), a hardener (B), and an inorganic filler (C) containing silica and alumina as an essential component, characterized in that the content of the inorganic filler (C) is 87–97 wt %, based on the total weight of the composition, and the inorganic filler (C) contains 0.1–50 wt % of alumina, and further characterized in that said epoxy resin (A) contains as an essential component a biphenyl type epoxy resin having the structure represented by the formula (1) below:

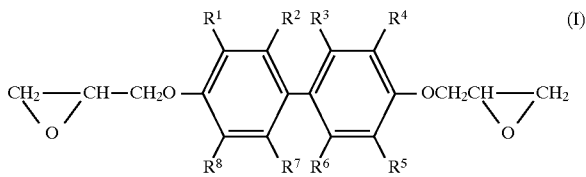

where $R^1$ to $R^8$ each denote a hydrogen atom, a halogen atom, or a $C_{1-4}$ alkyl group.

9. An epoxy resin composition as defined in claim 8, wherein the content of alumina is 1–50 wt % based on the weight of the inorganic filler (C).

10. An epoxy resin composition as defined in claim 9, wherein the content of silica is 50–99.0 wt % based on the weight of the inorganic filler (C).

11. An epoxy resin composition as defined in claim 8, characterized in that, after curing, it has a flame retardance rating of V-0 specified by UL94 standards.

12. A method of sealing a semiconductor device comprising applying an epoxy resin composition as defined in claims 1 or 8 to said semiconductor device and curing said epoxy resin composition to thereby seal said semiconductor device.

13. A process for producing an epoxy resin composition, said process comprising melt-mixing an epoxy resin (A), a hardener (B), and an inorganic filler (C) containing silica and 0.1–20 wt % of alumina, the amount of (C) being 70–97 wt % of the total amount of the resin composition, said epoxy resin (A) containing as an essential component a biphenyl type epoxy resin having the structure represented by the formula I below:

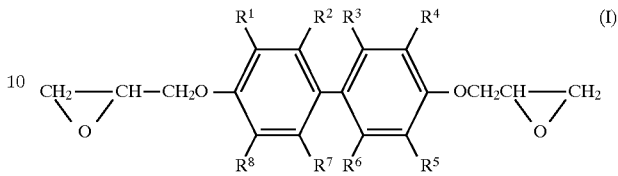

where $R^1$ to $R^8$ each denote a hydrogen atom, a halogen atom, or a $C_{1-4}$ alkyl group.

14. A process for producing an epoxy resin composition, said process comprising melt-mixing an epoxy resin (A), a hardener (B), and an inorganic filler (C) containing silica and 0.1–50 wt % of alumina, the amount of (C) being 87–97 wt % of the total amount of the resin composition, said epoxy resin (A) containing as an essential component a biphenyl type epoxy resin having the structure represented by the formula (I) below:

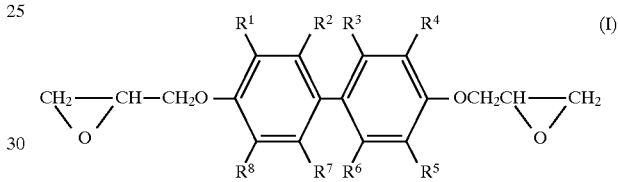

where $R^1$ to $R^8$ each denote a hydrogen atom, a halogen atom, or a $C_{1-4}$ alkyl group.

* * * * *